United States Patent
Letavic (10) Patent No.: US 7,659,584 B2
(45) Date of Patent: Feb. 9, 2010

(54) SUBSTRATE ISOLATED INTEGRATED HIGH VOLTAGE DIODE INTEGRATED WITHIN A UNIT CELL

(75) Inventor: Theodore James Letavic, Putnam Valley, NY (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/158,108

(22) PCT Filed: Dec. 12, 2006

(86) PCT No.: PCT/IB2006/054780

§ 371 (c)(1),
(2), (4) Date: Jun. 19, 2008

(87) PCT Pub. No.: WO2007/072304

PCT Pub. Date: Jun. 28, 2007

(65) Prior Publication Data

US 2008/0265327 A1    Oct. 30, 2008

Related U.S. Application Data

(60) Provisional application No. 60/751,532, filed on Dec. 19, 2005.

(51) Int. Cl.
*H01L 23/62* (2006.01)
*H01L 21/00* (2006.01)
*H01L 21/426* (2006.01)

(52) U.S. Cl. .......... 257/355; 438/506; 438/514
(58) Field of Classification Search .......... 257/355, 257/491, 409, 869, E21.235, E21.632, E21.409, 257/E29.001; 438/286, 140, 149, 221, 506, 438/514
See application file for complete search history.

(56) References Cited

U.S. PATENT DOCUMENTS

| | | | |
|---|---|---|---|
| 5,614,421 A | 3/1997 | Yang | |
| 6,967,380 B2 * | 11/2005 | Breitwisch et al. | 257/371 |
| 7,012,309 B2 * | 3/2006 | Germana | 257/372 |
| 2005/0245020 A1 * | 11/2005 | Zhu et al. | 438/213 |
| 2008/0303092 A1 * | 12/2008 | Letavic | 257/355 |
| 2008/0308874 A1 * | 12/2008 | Letavic et al. | 257/369 |

* cited by examiner

*Primary Examiner*—Thomas L Dickey
*Assistant Examiner*—Nikolay Yushin (57) ABSTRACT

An asymmetric semiconductor device (3) that includes an integrated high voltage diode (72), including: a substrate comprising an epitaxial layer (47) and a deep well implant (42) of a first type patterned above the epitaxial layer; a shallow trench isolation (STI) region (46) separating a cathode from an anode; a first well implant (40) of a second type residing below the anode; and a deep implant mask (34) of the second type patterned above the deep well implant and below both the cathode and a portion of the STI region.

20 Claims, 10 Drawing Sheets

| C50 PMU | | NCID | | | |
|---|---|---|---|---|---|
| | | | | (KeV) | |
| NI | P | 0280 | 5.50E+12 | 1800 | 7/27 |
| C50PMU P-CHL VT I/I | As | 9000 | 1.15E+13 | 140 | 7/27 |
| | P | 0086 | 7.00E+12 | 560 | 7/27 |
| | B | 0197 | 2.00E+12 | 360 | 7/27 |
| | B | 0167 | 6.00E+12 | 240 | 7/27 |
| C50PMU N CHL VT I/I | B | 9001 | 1.15E+13 | 25 | 7/27 |
| | In | P356 | 7.00E+12 | 150 | 7/27 |
| | P | 0161 | 3.0E+12 | 70 | 7/27 |
| | P | 0162 | 1.40E+12 | 220 | 7/27 |
| | P | 0163 | 5.00E+12 | 550 | 7/20 |
| | B | 0164 | 9.00E+12 | 180 | 7/27 |
| | B | 0165 | 1.00E+12 | 90 | 7/27 |
| | B | 0166 | 2.90E+12 | 25 | 7/27 |
| | B | 4103 | 2.60E+12 | 25 | 7/27 |
| PMU DP | B | 0182 | 1.00E+13 | 550 | 7/27 |
| Q4 PD I/I | P | P357 | 4.00E+15 | 30 | 0/0 |
| | B | 0183 | 1.20E+14 | 23 | 7/27 |
| SN | P | 0284 | 5.00E+13 | 70 | 0/0 |
| NL | P | 4417 | (7.5E12)*4 | 40 | 45/0 |
| PL | B | P136 | (7.5E12)*4 | 15 | 7/0 |
| | As | P359 | (5E13)*4 | 50 | 7/0 |
| | BF2 | P360 | (2.5E13)*4 | 20 | 7/0 |
| C50 N+ S/D | As | 0193 | 4.00E+15 | 60 | 0/0 |
| C50 P+ S/D | B | 3446 | 4.50E+15 | 5 | 7/22 |

FIG. 7

SUBSTRATE ISOLATED INTEGRATED HIGH VOLTAGE DIODE INTEGRATED WITHIN A UNIT CELL

The invention relates generally to semiconductor device structures, and more particularly, to a device having a substrate isolated high voltage diode.

High voltage diodes are needed to implement most portable power management functions, such as those found in cell phones and other portable electronics. Illustrative power management functions include up-converters, down-converters, auto-converters, battery charging, etc.

Present solutions typically implement a diode function using a hybrid circuit design in which a diode is located externally to the integrated circuit. Such implementations are costly since they require additional components to be designed and placed into the portable system. Moreover, because the diode is located externally to the integrated circuit, performance suffers since it is difficult to achieve high switching frequencies.

Accordingly, a need exists for a semiconductor device that integrates a high voltage diode into a semiconductor device in order to provide an efficient power management solution.

The present invention addresses the above-mentioned problems, as well as others, by providing a semiconductor device that integrates a high voltage diode into a semiconductor device in order to provide an efficient power management solution. Integration of such a diode into a semiconductor process flow reduces cost, but more importantly improves performance allowing much higher switching frequencies (>2 MHz) for power conversion. The high voltage diode results in the presentation of a complete integrated power management solution to customers with a single piece of silicon.

In a first aspect, the invention provides an asymmetric semiconductor device that includes an integrated high voltage diode, comprising: a substrate comprising an epitaxial layer and a deep well implant of a first type (e.g., a DNWell) patterned above the epitaxial layer; a shallow trench isolation (STI) region separating a cathode from an anode; a first well implant of a second type (e.g., HPW) residing below the anode; and a deep implant mask of the second type (e.g., a DPWell) patterned above the deep well implant and below both the cathode and a portion of the STI region.

In a second aspect, the invention provides a method of forming an asymmetric semiconductor device that includes an integrated high voltage diode, comprising: forming a substrate comprising an epitaxial layer; forming a deep well implant (e.g., a DNWell) of a first type above the epitaxial layer; forming a deep implant mask (e.g., a DPWell) of a second type above the deep well implant and below a cathode location; forming a first well implant of the second type (e.g., an HPW) below an anode location; and forming a shallow trench isolation (STI) region between the cathode location and the anode location, wherein a portion of the STI region resides above the first well implant of the second type.

In a third aspect, the invention provides an asymmetric semiconductor device that includes an integrated high voltage diode, comprising: a deep well implant; a shallow trench isolation (STI) region separating a cathode from an anode; a first well implant residing below the anode; and a deep implant mask patterned above the deep well implant and below both the cathode (36) and a portion of the STI region.

These and other features of this invention will be more readily understood from the following detailed description of the various aspects of the invention taken in conjunction with the accompanying drawings in which.

Figure 1:
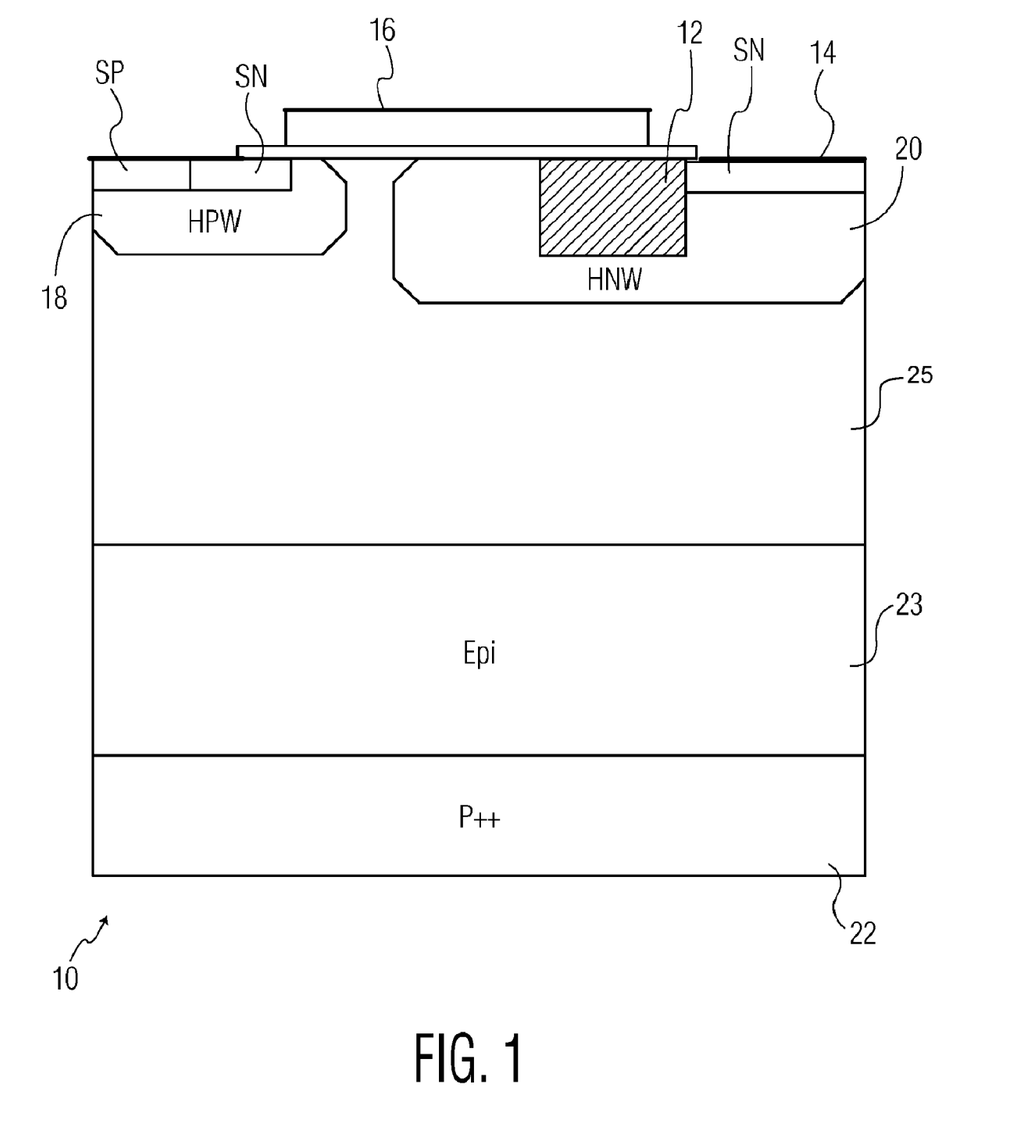
FIG. 1 depicts a cross-sectional layout of an asymmetric high voltage device integrated into a dense 0.25 um CMOS process flow by using a Shallow Trench Isolation (STI) region to form a dielectric between the drain and gate to allow for high voltage operation.

Described herein is an integrated semiconductor device that includes a high voltage diode (e.g., voltages above 25V) integrated within the unit cell (i.e., transistor). As noted above, high voltage diodes are needed, for instance, in portable electronics to provide efficient power management. FIG. 1 depicts an asymmetric high voltage devices structure integrated into a dense 0.25 μm CMOS process flow using the Shallow Trench Isolation (STI) region to form a dielectric between the drain and gate to allow for high voltage operation. As described below, the present invention further integrates a substrate isolated high voltage (HV) diode into such a structure with the addition of an extra deep-pwell implant. In addition, a polysilicon (PS)-walled layout may be further utilized to provide improved BVds and robustness.

FIG. 1 depicts a cross-section of an extended drain nchannel device 10 (EDNMOS), which is formed using STI region 12 within the unit cell of the device structure. The device 10 includes a p++ layer 22, an epitaxial layer (epi) 23, and a deep n-well (DNWell) layer 25. The STI region 12 forms a thick dielectric region between the drain 14 and gate 16, which allows the device 10 to support voltages much higher than that for which the baseline CMOS process flow is designed. In the present state of the art, there are two well and gate oxide thicknesses available to fabricate such a high voltage transistor, namely (a) GO1=5.4 nm thick with 2.5V (retrograde) wells, i.e., n-type well (NW) and p-type well (PW), or (b) GO2=12.3 nm thick with 5V (retrograde) wells, i.e., high voltage n-type well (HNW) and high voltage p-type well (HPW).

FIG. 1 depicts an asymmetric GO2 EDNMOS in which the HPW 18 is channel diffused for 5V NMOS, and the HNW 20 is channel diffused for 5V PMOS. The 2.5V modules could be used as well, replacing the HNW with NW and HPW with PW, and using the thin GO1 gate oxide. EDMOS devices fabricated with either GO1 or GO2 can block voltages over 25V, much higher than the baseline transistors are designed for, which is the basis of the concept described in the above-mentioned reference.

Note that an extended drain pchannel device could be implemented from the structure of FIG. 1 simply by reversing the wells, i.e., using the low-voltage PMOS process modules to form the extended drain PMOS (EDPMOS).

As noted above, the present invention further integrates a high voltage (HV) diode into an asymmetric device structure, such as that described in FIG. 1. The asymmetric design technique used to form the device structure of FIG. 1 can be extended to form substrate isolated HV diodes by adding a deep p-type well (DPWell) implant to the process flow so the active diode current can be isolated from the substrate 22. An STI region is again used inside the active unit cell of the diode for electric field control, and unique two-dimensional (2D) layout techniques are used to obtain breakdown voltages in excess of 30V in an integrated 0.25 μm CMOS process flow.

Figure 2A:
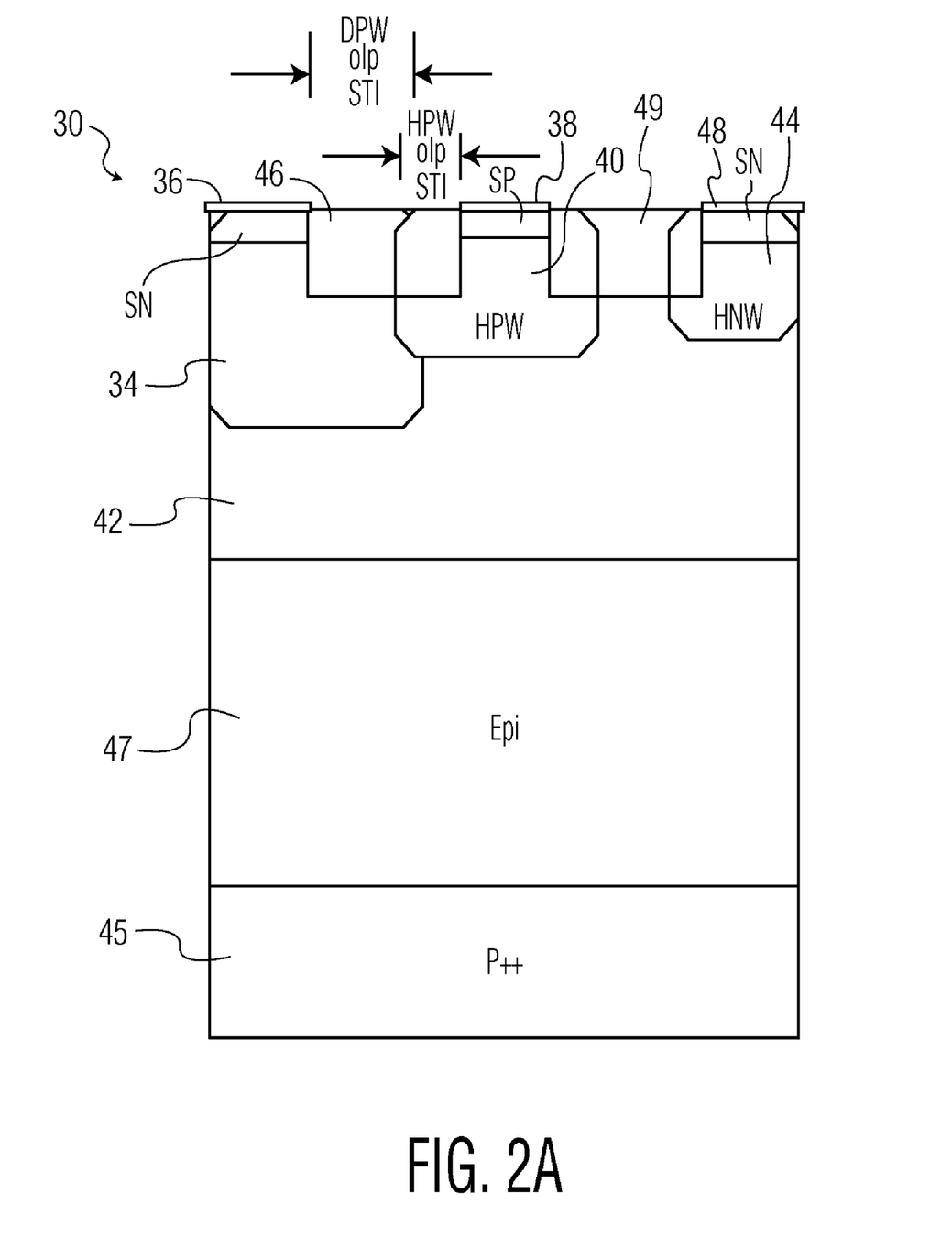
FIG. 2A depicts cross-sectional layouts of a high voltage isolated diode structure in accordance with the present invention.

FIG. 2A shows a 2D cross-section of a device 30 that includes a high voltage substrate isolated diode that can be fabricated in accordance with the process flow used to form the device shown in FIG. 1, with the addition of a deep-p implant mask, DPWell layer 34. As shown, device 30 includes a p++ layer 45, an epitaxial layer (epi) 47 layer, and a DNWell layer 42 that provides substrate isolation. An HPW link up layer 40 is provided between the DNWell layer 42 and the SP anode 38 (i.e., source). SIT region 46 resides between the SP anode 38 and the SN cathode 36. The DPWell layer 34 resides beneath the SN cathode 36 and a portion of SIT region 46.

Figure 2B:
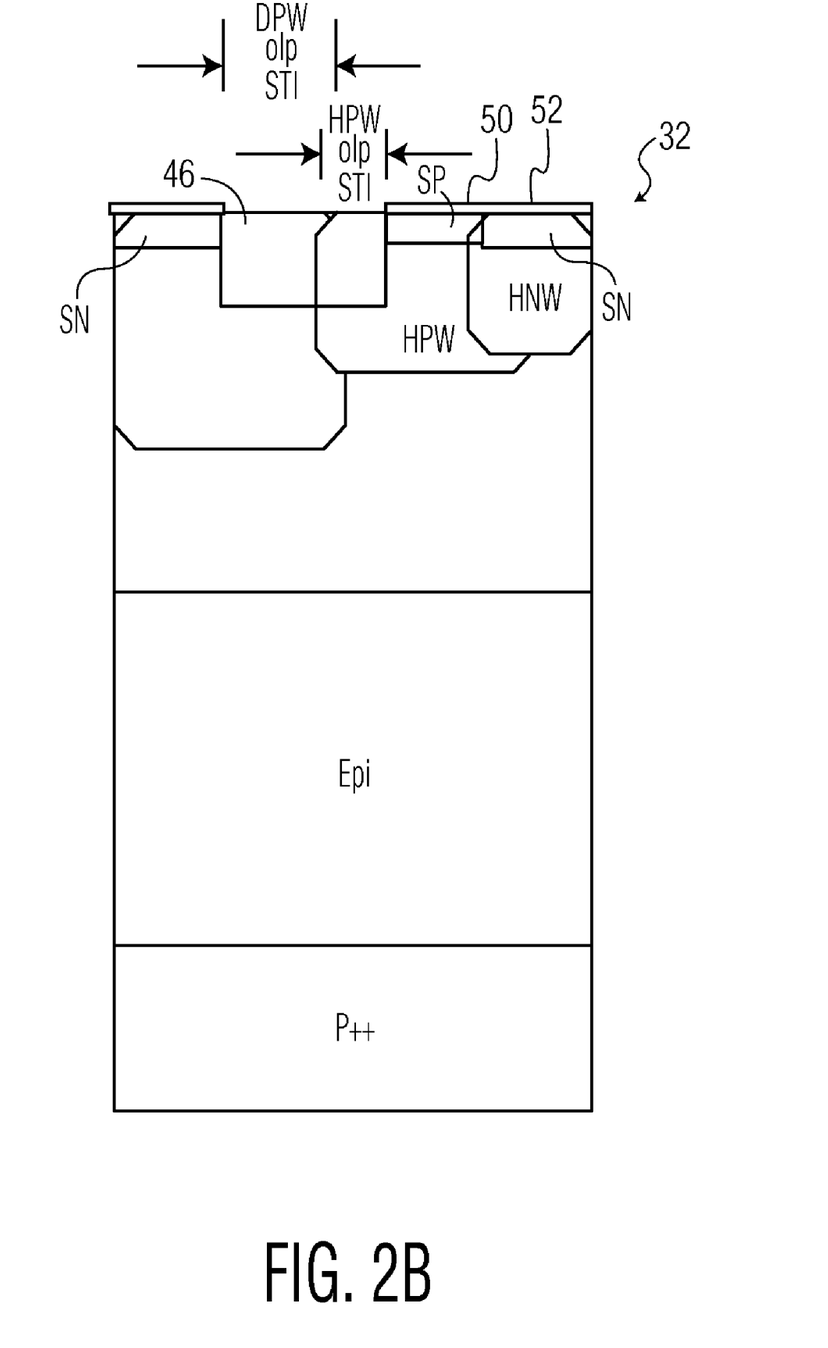
FIG. 2B depicts cross-sectional layouts of an alternative embodiment of a high voltage isolated diode structure in accordance with the present invention.

With the DPWell layer 34 in place, current flows from the SN cathode 36, through the DPWell layer 34 and out the SP anode 38 through the p-type HPW link up layer 40. The HPW link up layer 40 is formed from the 5V CMOS well step of the process flow. There is an additional contact made to the DNWell substrate isolation layer 42 through the n-type HNW layer 44 from the 5V CMOS wells 34 and 40. This is shorted to a second SN cathode 48 to provide substrate isolation. As shown in FIG. 2A, a second STI region 49 is located between the SP anode 38 and the SN cathode, which act as shorted contacts. FIG. 2B depicts an alternative embodiment of a device 32 that includes a high voltage substrate isolated diode in which the shorted contacts 50, 52 are butted together, without a second STI region 49.

Accordingly, each of the devices shown in FIGS. 2A and 2B provide an asymmetric 25V-30V diode construction with the STI region 46 inside the unit cell fabricated using the GO2 and HNW, HPW from the 5V baseline CMOS flow for contact to the buried layers, anode and cathode of the diode. Both the n-type and p-type well implants are patterned within the device unit cell to form these contacts. The device may, for example, include a DNWell implant ~1-2 MeV 5e12 cm-2 31 Phos for substrate isolation and a DPWell implant of 500-700 keV 1e13 cm-2 11 B for deep isolation (wherein 31 Phos and 11B are implant species, i.e., phosphorus and boron for n-type and p-type doping, respectively). Alternatively, the devices of FIGS. 2A and 2B may be fabricated using the GO1 and NW, PW from the 2.5V baseline CMOS flow for contact to the buried layers, anode and cathode of the diode.

Figure 3A:
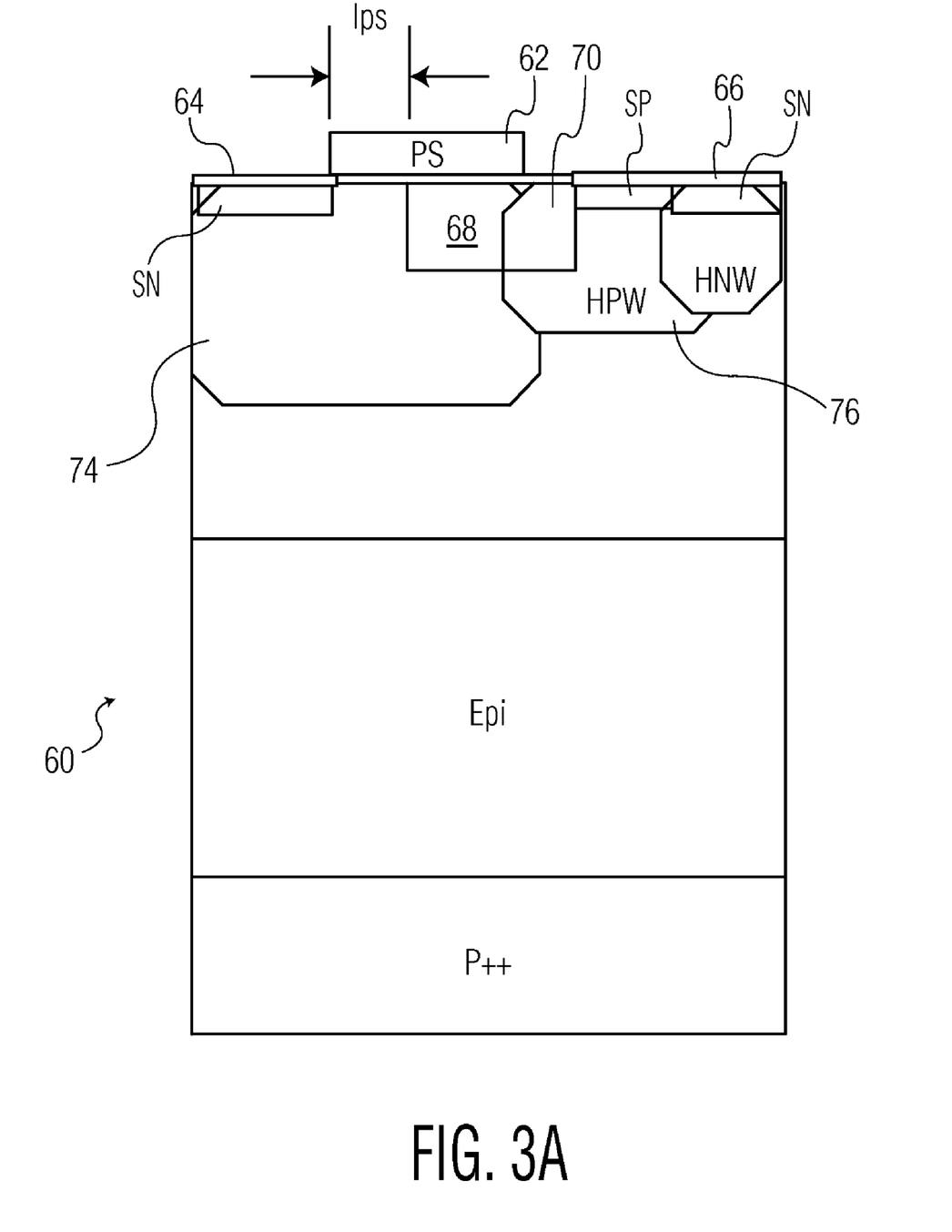
FIGS. 3A and 3B depict cross-sectional layouts of a polysilicon-walled diode structure in which the cathode contact SN is physically removed from the STI edge by self-alignment to the polysilicon layer in accordance with the present invention.
Figure 3B:
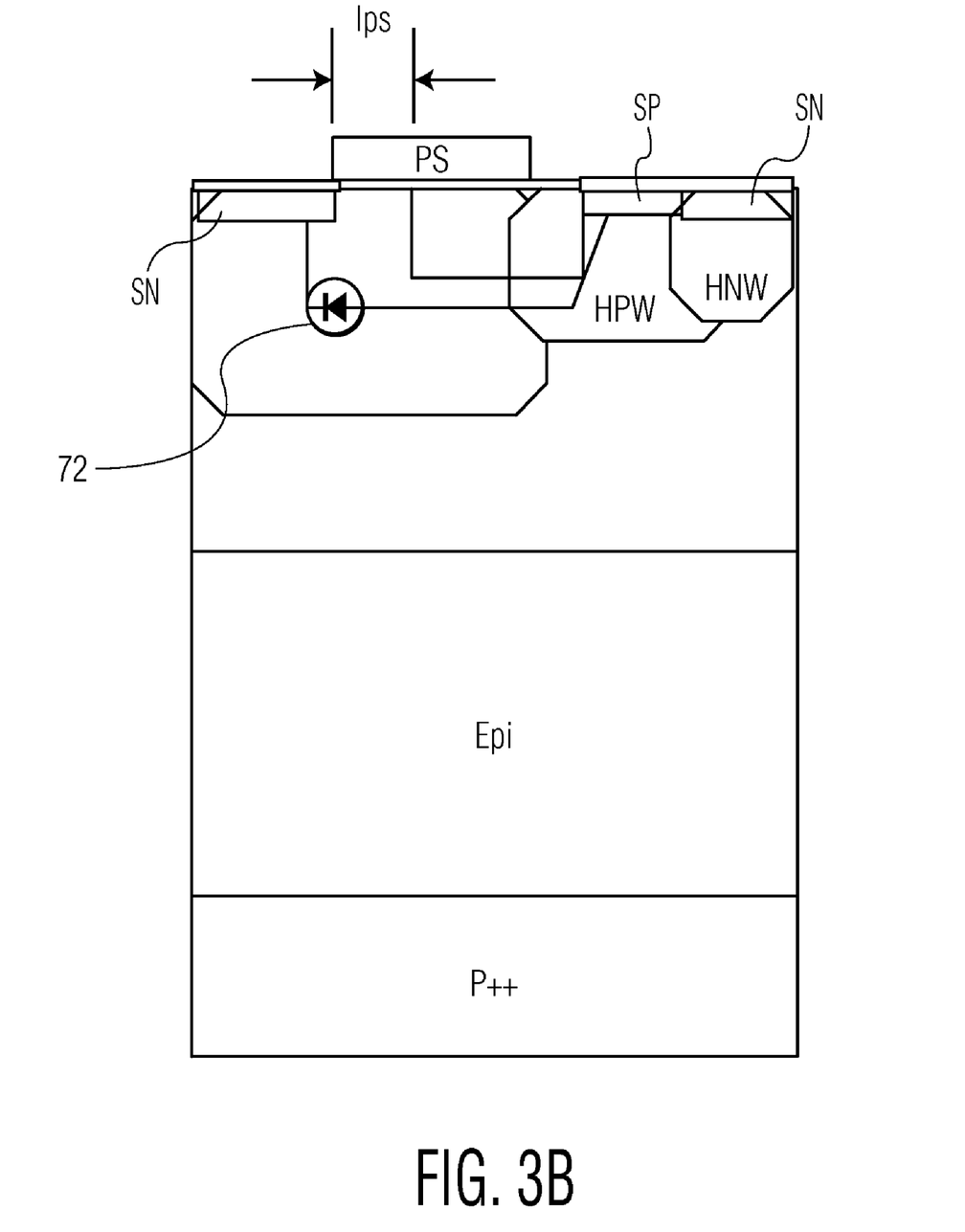

FIG. 3A depicts a cross-section of a further alternative embodiment of a device 60 having an isolated HV diode. In this case, the diode is walled with polysilicon (PS) 62, which provides a device 60 that is more robust in avalanche breakdown. In this case, electrical contact to the SP anode 66 from the SN cathode 64 is separated from the STI edge 68 by a layer of polysilicon 62, and the SN cathode 64 is made by conventional self-alignment to the PS layer. This has the advantage of providing reproducible electrical separation between the cathode contact and the edge 68 of the STI 70. This reduces electric field crowding and improves breakdown voltage. The PS 62 is shorted to the SN cathode contact 64 in the third dimension. Thus, a polysilicon-walled diode structure is provided in which the SN cathode contact 64 is physically removed from the STI edge 68 by self-alignment to the PS layer 62. The electrical diode 72 is shown in FIG. 3B for clarity.

Thus, FIG. 3A provides an asymmetric 25V-30V PS walled diode construction with the STI region 70 inside the unit cell fabricated using the GO2 and HNW, HPW from the 5V baseline CMOS flow for contact to the buried layers, anode and cathode of the diode. Both the n-type and p-type well implants are patterned within the device unit cell to form these contacts. The device may include a deep NW implant ~1-2 MeV 5e12 cm-2 31 Phos for substrate isolation and a deep PW implant of 500-700 keV 1e13 cm-2 11 B for deep isolation. Alternatively, the device of FIG. 3A may be fabricated using the GO1 and NW, PW from the 2.5V baseline CMOS flow for contact to the buried layers, anode and cathode of the diode.

Figure 4A:
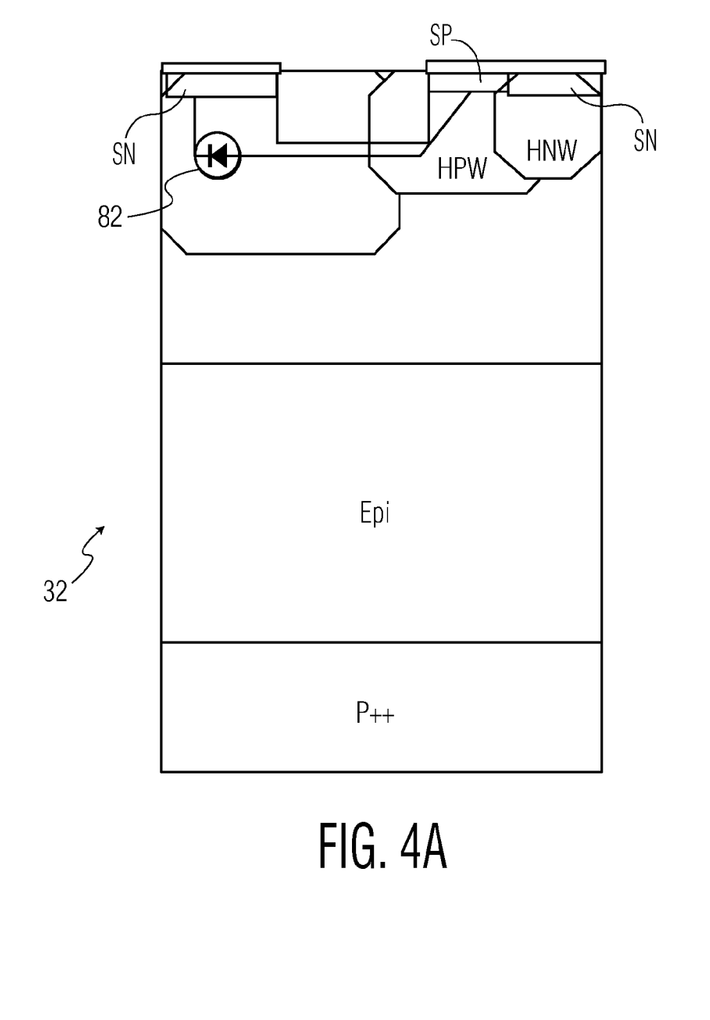
FIG. 4 depicts an electrical simulation of the standard diode provided in FIG. 2A.
Figure 4B:
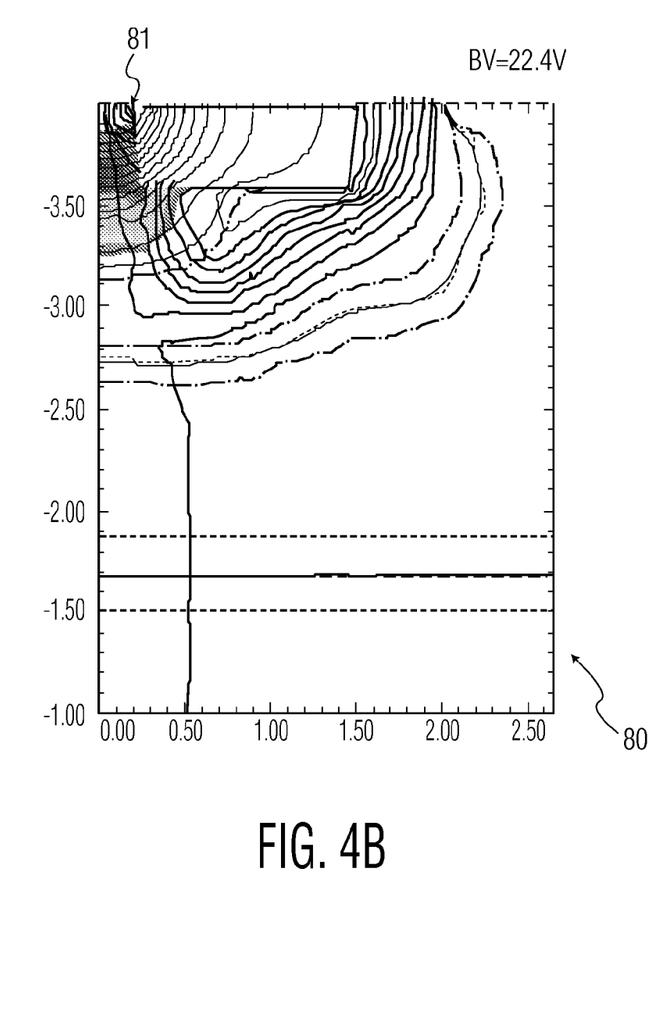

FIGS. 4A and 4B depict a breakdown voltage simulation (right side) of the standard diode 82 provided by the structure 32 (left side) shown in FIG. 2B. As can be seen in FIG. 4B, a high electric field at the SN/STI boundary 80 results in a low breakdown voltage and instability. Contours on the right depict impact ionization. The simulation shows that the electrical performance of the diode 82 is limited by the electric field at the SN/STI boundary 80. The PS walled design shown in FIG. 3A reduces this electric field by separating the SN cathode 64 and the STI edge 68. A layout parameter for the PS walled STI diode is the offset distance 1 ps (FIGS. 3A and 3B), the distance between the hard cathode implant and the edge 68 of the shallow trench isolation 70. This dimension may be on the order of 0.5 μm to 2.0 μm for 30V devices.

Figure 5A:
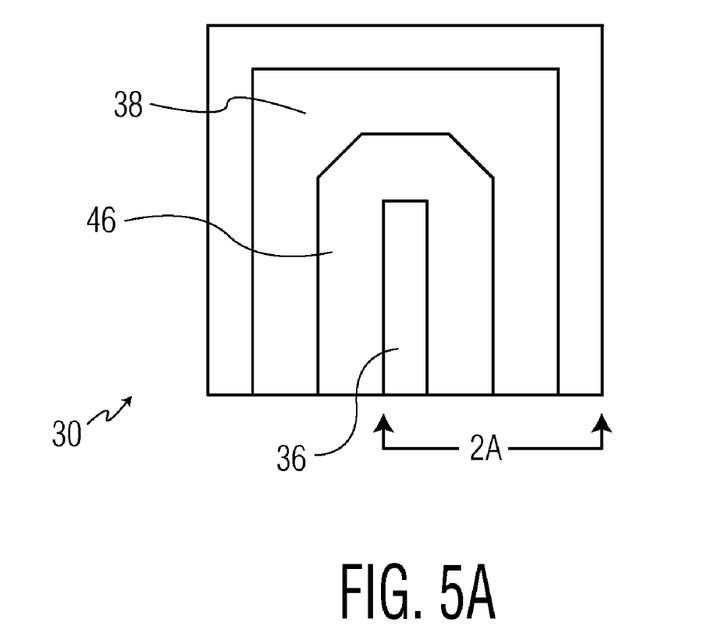
FIGS. 5A-D depict 2D surface layouts of the embodiments of FIGS. 2A and 3A.
Figure 5B:
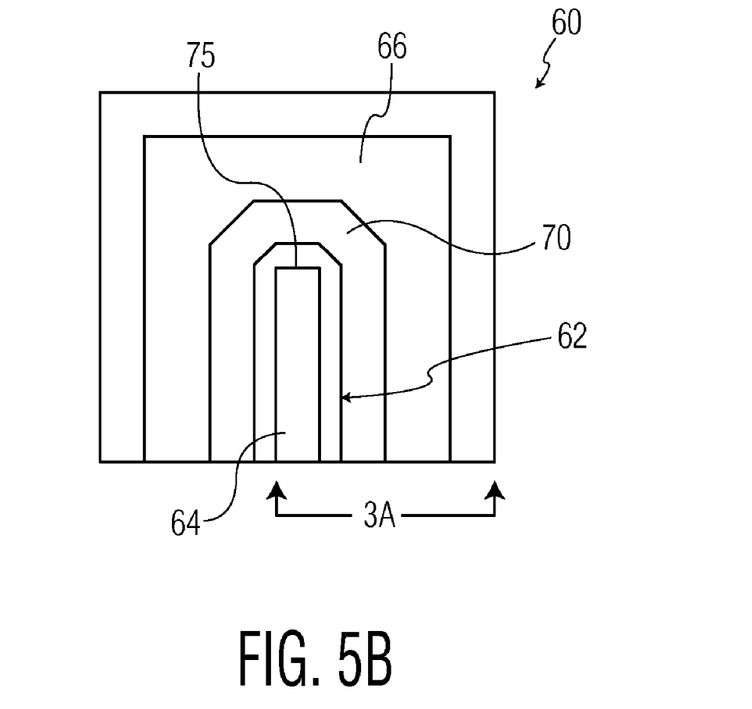

FIGS. 5A and 5B depict 2D surface layouts for the devices shown in FIG. 2A and FIG. 3A, respectively, i.e., normal and PS walled diode structures. As can be seen, the devices are implemented in ring-like fashion (top halves shown in FIGS. 5A-D). As shown in FIG. 5A, the diode structure 30 comprises a non-active (STI) region 46 separating a ring made up of the active SP anode 38 and the active SN cathode 36. The SN cathode 36 is the center finger or stripe, which is surrounded on all sides by a non-active (STI) region 46, which is then surrounded on all sides by the active SP anode 48.

Figure 5C:
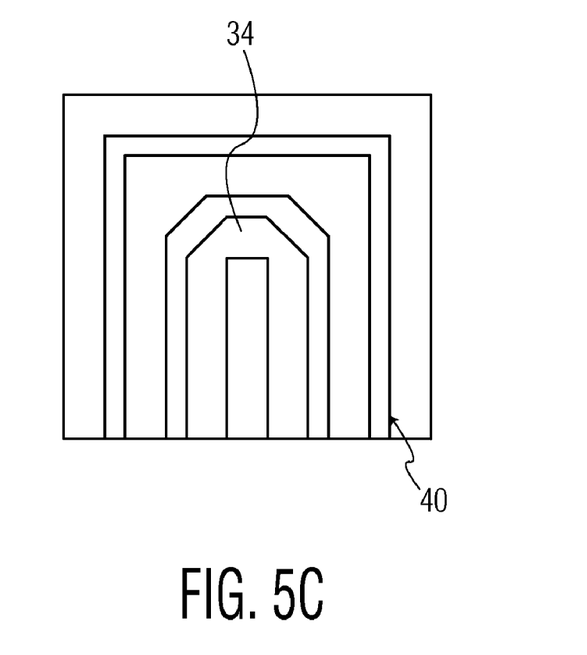
Figure 5D:
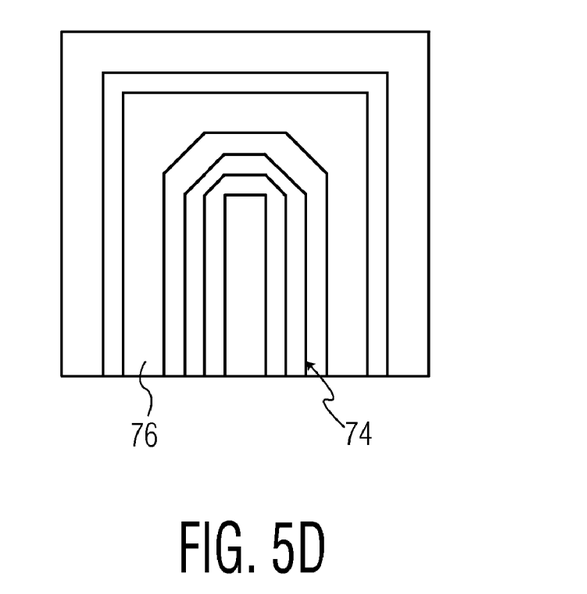

In FIG. 5B, a PS walled structure 62 is provided such that a portion of the cathode region between the SN cathode contact 64 and the STI region 70 is covered by polysilicon (PS). FIGS. 5C and 5D further show the locations of the HPWs 40, 76 and DPWs 34, 74, relative to the other surface features, for the devices of FIGS. 2A and 3A, respectively.

Accordingly, a device is provided that has a surface layout that is substantially ring-like in nature, with the STI width in the cylindrical device section being at least 1.2 times the width in the linear section. The SN cathode is located in the center of the ring, and the device is surrounded and terminated on all sides by the SP anode. In the PS-walled embodiment (FIGS. 3A, 5B), the PS-walled layer 62 is shorted to the SN cathode 64 anywhere along the third dimension of the cathode stripe, e.g., at the terminal end 75 of the cathode stripe 64.

As noted, for the structures shown in FIGS. 2A, 2B and 3A, the contact to the buried layers, DNWell and DPWell, can be realized using retrograde well implants for the 5V CMOS (HNW, HPW) shown, or 2.5V CMOS (NW, PW) not shown. The oxide layer beneath the PS over the active (non STI) region can be GO2 or GO1.

Figure 6:
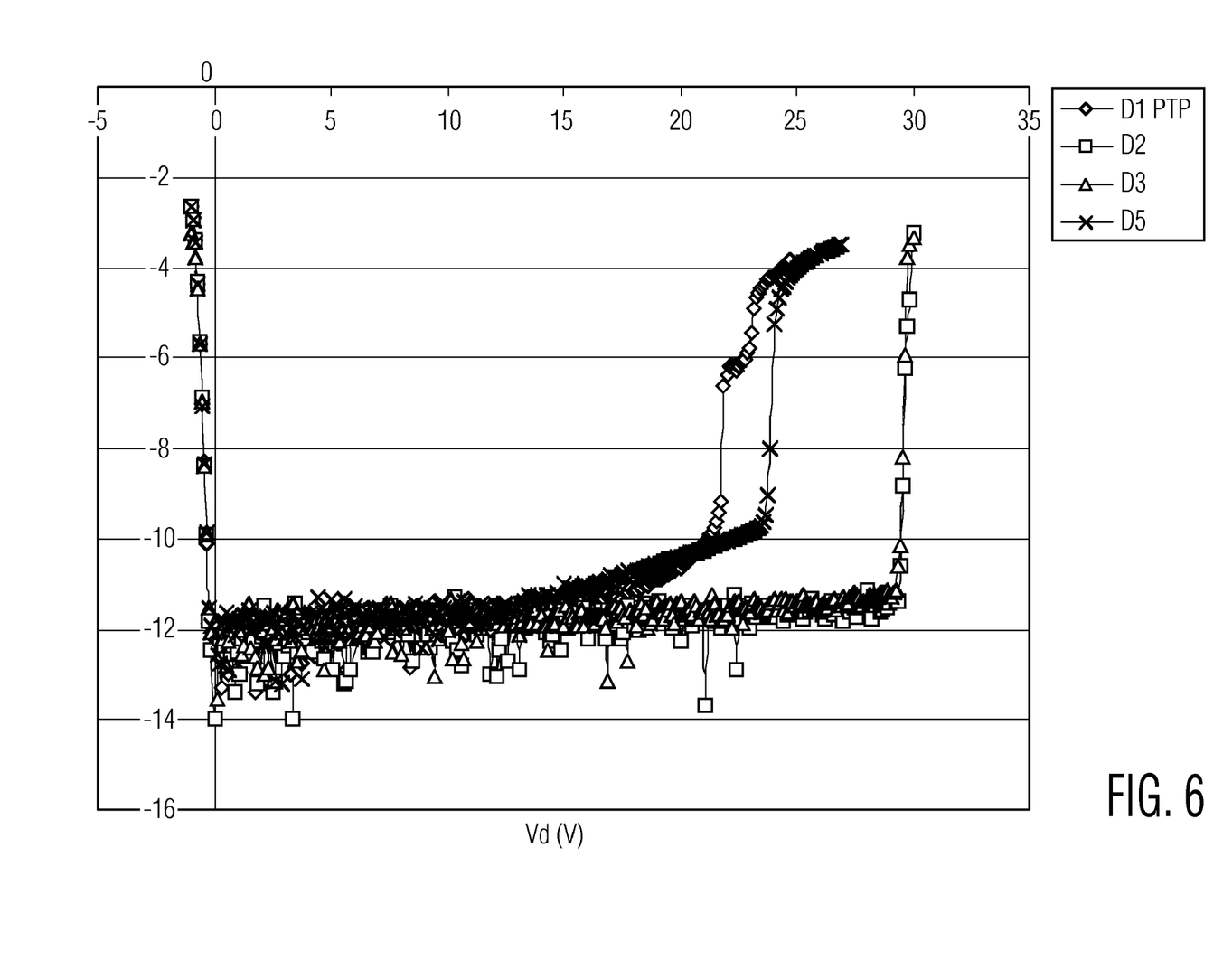
FIG. 6 depicts experimental results that measure log IV characteristics of the high voltage diodes of FIGS. 2A and 3A.

FIG. 6 shows experimental results of measured log IV characteristics for the different versions of HV diodes D1 PIP, D2, D3, and D5, including the HV diodes presented in FIGS. 2A, 2B and 3A. The use of the PS-walled structure shown in FIG. 3A gives superior electrical results, with ideal breakdown voltage to 30V obtained. The PS walled design (D5) increases the breakdown voltage from 24 to 30V, and exhibits ideal leakage characteristics without punch-through. The PS walled diode thus results in lower electric fields along the STI vertical surface closest to the SN (Cathode), resulting in higher breakdown voltage and more robust avalanche behavior. FIG. 6, which depicts log of the drain current versus drain voltage shows that this has been demonstrated in silicon.

Figure 7:
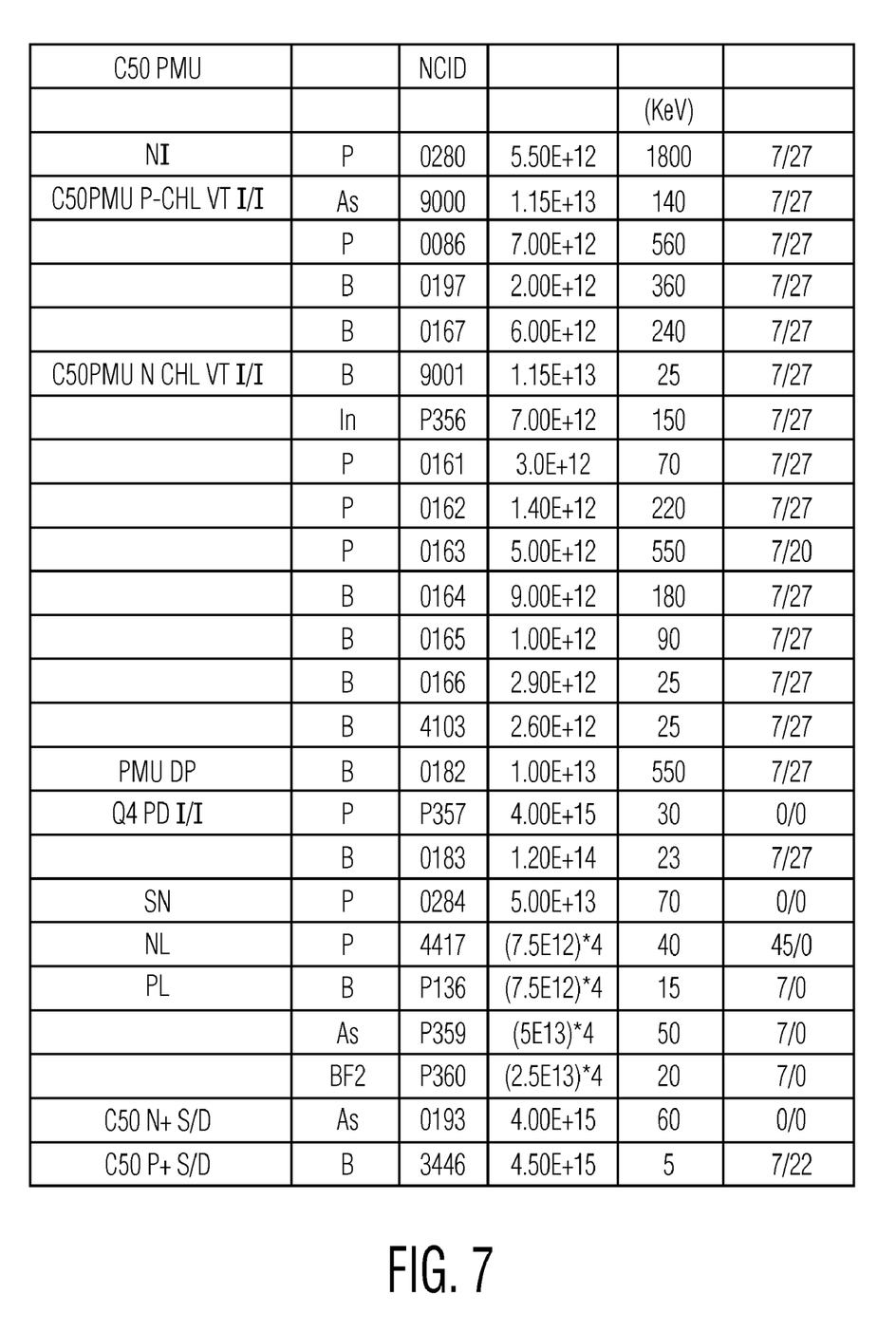
FIG. 7 depicts a table with specie, dose and energy information in accordance with the present invention.

Illustrative doses and material parameters for the devices described above may be as follows. With reference to FIG. 2A, the p++ substrate 45 may be implemented with a 4 μm-thick p−− epitaxial layer 47. A GO1 oxide thickness of 5.0-5.4 nm, or GO2 oxide thickness of 12.3-15 nm could be utilized. An STI depth of 0.35-0.45 μm may also be utilized. FIG. 7 depicts a table depicting illustrative species, doses and energy for retrograde wells for both 5V and 2.5V components. (N-type isolation "NI" and power management deep-p "PMU DP" are shaded).

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. An asymmetric semiconductor device that includes an integrated high voltage diode, comprising:
   a deep well implant;
   a shallow trench isolation (STI) region separating a cathode from an anode;
   a first well implant residing below the anode; and
   a deep implant mask patterned above the deep well implant and below both the cathode and a portion of the STI region, wherein the deep implant mask is completely separated from the epitaxial layer by the deep well implant.

2. An asymmetric semiconductor device that includes an integrated high voltage diode, comprising:
   a substrate comprising an epitaxial layer and a deep well implant of a first type patterned above the epitaxial layer;
   a shallow trench isolation (STI) region separating a cathode from an anode;
   a first well implant of a second type residing below the anode; and
   a deep implant mask of the second type patterned above the deep well implant and below both the cathode and a portion of the STI region, wherein the deep implant mask is completely separated from the epitaxial layer by the deep well implant.

3. The asymmetric semiconductor device of claim 2, further comprising a polysilicon wall that resides above the STI region between the cathode and anode, wherein the cathode is separated from an edge of the STI region, and wherein the polysilicon wall is shorted to the cathode.

4. The asymmetric semiconductor device of claim 2, further comprising a second well implant of the first type that resides next to the first well implant.

5. The asymmetric semiconductor device of claim 4, wherein the first well implant and the second well implant are separated by a second STI region.

6. The asymmetric semiconductor device of claim 2, having a surface layout includes a ring-like structure in which a centrally located cathode is surrounded by the STI region, and the STI region is surrounded by the anode.

7. The asymmetric semiconductor device of claim 2, wherein the STI region has a thickness of 0.35-0.45 μm.

8. The asymmetric semiconductor device of claim 2, wherein:
   the first type comprises an n-type, such that the deep well implant comprises a deep n-type well (DNwell)
   the second type comprises a p-type, such that the deep implant mask comprises a deep p-type well (DPWell) and the first well implant comprises a p-type well.

9. The asymmetric semiconductor device of claim 8, wherein the p-type well is a high voltage p-type well (HPW) comprising a 5 volt retrograde well that is approximately 12.3-15 nm thick.

10. The asymmetric semiconductor device of claim 8, wherein the p-type well comprises a 2.5 volt retrograde well that is approximately 5.0-5.4 nm thick.

11. The asymmetric semiconductor device of claim 8, wherein:
   the DPWell comprises an implant that is approximately 1-2 MeV 5e12 cm-2 31 Phos for substrate isolation; and
   the DPWell comprises an implant that is approximately 500-700 keV 1e13 cm-2 11 B for deep isolation.

12. A method of forming an asymmetric semiconductor device that includes an integrated high voltage diode, comprising:
   forming a substrate comprising an epitaxial layer;
   forming a deep well implant of a first type above the epitaxial layer;
   forming a deep implant mask of a second type above the deep well implant and below a cathode location, wherein the deep implant mask is completely separated from the epitaxial layer by the deep well implant;
   forming a first well implant of the second type below an anode location; and
   forming a shallow trench isolation (STI) region between the cathode location and the anode location, wherein a portion of the STI region resides above the first well implant of the second type.

13. The method of claim 12, further comprising the step of forming a polysilicon wall above the STI region between a cathode and an anode, wherein the cathode is separated from an edge of the STI region, and wherein the polysilicon wall is shorted to the cathode.

14. The method of claim 12, further comprising forming a second well implant of the first type next to the first well implant.

15. The method of claim 14, wherein the first well implant and the second well implant are separated by a second STI region.

16. The method of claim 12, wherein the device comprises a surface layout having a ring-like structure in which a centrally located cathode is surrounded by the STI region, and the STI region is surrounded by an anode.

17. The method of claim 12, wherein the STI region has a thickness of 0.35-0.45 μm.

18. The method of claim 12, wherein:
   the first type comprises an n-type, such that the deep well implant comprises a deep n-type well (DNwell),
   the second type comprises a p-type, such that the deep implant mask comprises a deep p-type well (DPWell) and the first well implant comprises a p-type well.

19. The method of claim 18, wherein the p-type well is a high voltage p-type well (HPW) comprising a 5 volt retrograde well that is approximately 12.3-15 nm thick.

20. The method of claim 18, wherein:
   the p-type well comprises a 2.5 volt retrograde well that is approximately 5.0-5.4 nm thick;
   the DPWell comprises an implant that is approximately 1-2 MeV 5e12 cm-2 31 Phos for substrate isolation; and
   the DPWell comprises an implant that is approximately 500-700 keV 1e13 cm-2 11 B for deep isolation.

* * * * *